United States Patent
Song et al.

(10) Patent No.: US 7,888,667 B2
(45) Date of Patent: *Feb. 15, 2011

(54) PHASE CHANGE MEMORY DEVICE

(75) Inventors: Yoon-Jong Song, Seoul (KR); Se-Ho Lee, Seoul (KR); Ki-Nam Kim, Anyang-si (KR); Su-Youn Lee, Yongin-si (KR); Jae-Hyun Park, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 176 days.

This patent is subject to a terminal disclaimer.

(21) Appl. No.: 12/008,125

(22) Filed: Jan. 9, 2008

(65) Prior Publication Data

US 2008/0173862 A1  Jul. 24, 2008

Related U.S. Application Data

(63) Continuation of application No. 11/149,755, filed on Jun. 10, 2005, now Pat. No. 7,339,185.

(30) Foreign Application Priority Data

Jul. 19, 2004  (KR) .............................. 2004-56000

(51) Int. Cl.
H01L 47/00 (2006.01)
H01L 21/00 (2006.01)
G11C 11/00 (2006.01)

(52) U.S. Cl. ....................... 257/3; 257/2; 257/4; 257/5; 257/E45.002; 365/151; 365/163

(58) Field of Classification Search ................. 257/2–5, 257/E45.002; 365/151, 163
See application file for complete search history.

(56) References Cited

U.S. PATENT DOCUMENTS

| 6,031,287 | A | 2/2000 | Harshfield |
| 6,420,725 | B1 | 7/2002 | Harshfield |
| 6,534,781 | B2 | 3/2003 | Dennison |
| 6,545,287 | B2 | 4/2003 | Chiang |
| 6,764,894 | B2 | 7/2004 | Lowrey |
| 6,972,430 | B2 * | 12/2005 | Casagrande et al. ............ 257/4 |
| 6,985,377 | B2 | 1/2006 | Rust |
| 7,242,019 | B2 | 7/2007 | Wicker |
| 7,339,185 | B2 * | 3/2008 | Song et al. ..................... 257/3 |
| 2002/0017701 | A1 | 2/2002 | Klersy et al. |
| 2005/0122771 | A1 * | 6/2005 | Chen ......................... 365/163 |

FOREIGN PATENT DOCUMENTS

KR  10-2004-0032955  4/2004

* cited by examiner

*Primary Examiner*—Shouxiang Hu
(74) *Attorney, Agent, or Firm*—Mills & Onello, LLP

(57) ABSTRACT

A phase change memory device includes a mold layer disposed on a substrate, a heating electrode, a filling insulation pattern and a phase change material pattern. The heating electrode is disposed in an opening exposing the substrate through the mold layer. The heating electrode is formed in a substantially cylindrical shape, having its sidewalls conformally disposed on the lower inner walls of the opening. The filling insulation pattern fills an empty region surrounded by the sidewalls of the heating electrode. The phase change material pattern is disposed on the mold layer and downwardly extended to fill the empty part of the opening. The phase change material pattern contacts the top surfaces of the sidewalls of the heating electrode.

5 Claims, 13 Drawing Sheets

PHASE CHANGE MEMORY DEVICE

CROSS-REFERENCE TO RELATED APPLICATIONS

This U.S. non-provisional patent application is a continuation of U.S. application Ser. No. 11/149,755, filed Jun. 10, 2005, which claims priority under 35 U.S.C. §119 of Korean Patent Application 2004-56000 filed on Jul. 19, 2004, the entire contents of which are hereby incorporated by reference.

BACKGROUND OF THE INVENTION

1. Field of the Invention

The present invention relates to a semiconductor device and a method for forming the same, and in particular, to a phase change memory device and a method for forming the same.

2. Description of the Related Art

Recently, a phase change memory device has been suggested as a new semiconductor device. The phase change memory device has a nonvolatile property of maintaining stored data when power supply is stopped. A unit cell of the phase change memory device uses a phase change material as a data storing medium. The phase change material has two stable states (amorphous state and crystalline state) by a provided heat. A generally—known phase change material is a compound of Ge, Sb and Te, commonly referred to as GST material (Ge—Sb—Te).

When the GST is heated for a short time at a temperature close to a melting point and is then sharply cooled, the GST has an amorphous state. If the GST is heated for a long time at a crystallization temperature lower than the melting point and slowly cooled, the GST has a crystalline state. Here, the amorphous GST has a higher specific resistance than the crystalline GST. Therefore, whether the information stored in the phase change memory cell is logical '1' or '0' can be decided by sensing an amount of current flowing through the phase change material.

Joule heat is used as the heat supplied to the phase change material. That is, when the current is supplied to an electrode connected to the phase change material, the Joule heat is generated from the electrode and supplied to the phase change material. The temperature of the heat supplied to the phase change material is dependent upon the amount of the supplied current.

FIG. 1 is a cross-sectional diagram illustrating a data storing medium of a conventional phase change memory cell.

Referring to FIG. 1, an interlayer insulation film 2 is disposed on a semiconductor substrate. A lower electrode 4 fills a contact hole 3 exposing a predetermined region of the semiconductor substrate 1 through the interlayer insulation film 2. The lower electrode 4 is formed in a contact plug shape. A GST film pattern 5 and an upper electrode 6 are sequentially stacked on the interlayer insulation film 2. The GST film pattern 5 contacts the top surface of the lower electrode 4. The GST film pattern 5 is formed in a crystalline state.

To program or erase the GST film pattern 5, a current is supplied to the lower electrode 4. The Joule heat is generated from the lower electrode 4, and supplied to the GST film pattern 5 through the contact surface between the GST film pattern 5 and the lower electrode 4. Depending on the amount of the supplied current and the duration of application of the current, a program region 7 of the GST film pattern 5 has the amorphous or crystalline state.

The program region 7 is formed to sufficiently cover the lower electrode 5. There is thus a distinct difference in the amount of the current flowing through the GST film pattern 5 according to the state (amorphous or crystalline state) of the GST film pattern 5. Since the generated heat is isotropically supplied to the GST film pattern 5, the program region 7 is formed in a hemispherical shape.

With the high integration and low power consumption tendency of the semiconductor device, research has been made to reduce the amount of the operation current (program or erase operation current) of the phase change memory device. Specifically a large amount of operation current is required to generate a high temperature for changing the state of the GST film pattern 5. Accordingly, a channel width of a MOS transistor for controlling the operation current increases. There is thus a limit in the ability to reduce the size of the phase change memory device.

One method for reducing the operation current of the phase change memory device is to reduce the width of the contact hole 3. As the width of the contact hole 3 decreases, the sectional width of the lower electrode 4 decreases, and the resistance of the lower electrode 4 increases. Even if the operation current decreases, the high temperature Joule heat can be generated. However, the contact hole 3 is formed by a patterning process including a photolithography process. As a result, there is a limit to reduction in the width of the contact hole 3 due to the limit of the photolithography process.

SUMMARY OF THE INVENTION

The present invention is directed to a phase change memory device which can minimize an operation current, and a method for forming the same.

An aspect of the present invention is to provide a phase change memory device which can achieve high integration and/or low power consumption, and a method for forming the same.

In one aspect, the invention is directed to a phase change memory device which includes a mold layer disposed on a substrate. A substantially cylindrical heating electrode is disposed in an opening in the mold layer that extends to the substrate through the mold layer, and the heating electrode has its sidewalls conformally disposed on lower inner walls of the opening. A filling insulation pattern is surrounded by sidewalls of the heating electrode. A phase change material pattern is disposed on the mold layer, the filling insulation pattern and the sidewalls of the heating electrode. The phase change material pattern is downwardly extended into the opening. The phase change material pattern contacts top surfaces of the sidewalls of the heating electrode.

In one embodiment, a top surface of the filling insulation pattern has the same height as that of a top surface of the mold layer. Alternatively, the top surface of the filling insulation pattern can be lower than a top surface of the mold layer and higher than the top surfaces of the sidewalls of the heating electrode. In one embodiment, a top surface of the filling insulation pattern has the same height as that of the top surfaces of the sidewalls of the heating electrode.

The top edges of the opening and top edges of the filling insulation pattern can be curved.

The device can further include a conductive barrier pattern disposed on the phase change material pattern.

In one embodiment, the mold layer comprises a lower insulation layer disposed on the substrate and having a first hole. An upper insulation layer is disposed on the lower insulation layer with a second hole aligned on the first hole and having a larger width than the first hole. An insulation spacer is formed on the sidewalls of the second hole. The inner walls of the insulation spacer are aligned on the sidewalls of the first hole.

In this embodiment, the heating electrode and the filling insulation pattern can be disposed in the first hole, and the phase change material pattern can fill an empty space of the second hole surrounded by the insulation spacer. A conductive barrier pattern can be disposed on the phase change material pattern.

In accordance with another aspect, the invention is directed to a method for forming a phase change memory device. According to the method, a mold layer is formed on a substrate, the mold layer having an opening that exposes a predetermined region of the substrate. A substantially cylindrical heating electrode is formed having its sidewalls conformally disposed on the lower inner walls of the opening. A filling insulation pattern is formed surrounded by the sidewalls of the heating electrode. A phase change material pattern is formed on the mold layer, the filling insulation pattern and the sidewalls of the heating electrode, the phase change material pattern extending into the opening in the mold layer. The phase change material pattern contacts the top surfaces of the sidewalls of the heating electrode.

In one embodiment, forming the mold layer, the heating electrode and the filling insulation pattern includes forming the mold layer on the substrate. The opening exposing the substrate is formed by patterning the mold layer. A conformal electrode conductive film is formed over the substrate. A filling insulation film is formed to fill the opening on the electrode conductive film. The electrode conductive film and the filling insulation film are planarized to form a preliminary heating electrode and the filling insulation pattern that are sequentially stacked. The heating electrode is formed by selectively recessing the preliminary heating electrode.

In one embodiment, the filling insulation pattern is selectively recessed, so that a top surface of the recessed filling insulation pattern is lower than a top surface of the mold layer and higher than the top surfaces of the sidewalls of the heating electrode. Top edges of the opening and top edges of the filling insulation pattern can be formed in a curved shape before forming the phase change material. In one embodiment, the filling insulation pattern is selectively recessed, so that a top surface of the recessed filling insulation pattern has the same height as that of the top surfaces of the sidewalls of the heating electrode. In this embodiment, top edges of the opening can be formed in a curved shape before forming the phase change material pattern.

In one embodiment, a conductive barrier pattern is disposed on the phase change material pattern.

In one embodiment, forming the mold layer, the heating electrode and the filling insulation pattern comprises forming a first hole exposing the predetermined region of the substrate by patterning a lower insulation layer formed on the substrate. An electrode conductive film is conformally formed over the substrate. A filling insulation film for filling the first hole is formed on the electrode conductive film. The filling insulation film and the electrode conductive film are planarized to form the heating electrode and the filling insulation layer that are sequentially stacked in the first hole. An upper insulation layer is formed over the substrate. A second hole exposing the heating electrode and the filling insulation pattern and having a larger width than the first hole is formed by patterning the upper insulation layer. An insulation spacer is formed on the inner walls of the second hole. The insulation spacer is aligned on the inner walls of the first hole to expose the heating electrode. The mold layer comprises the lower insulation layer, the upper insulation layer and the insulation spacer, and the opening in the mold layer comprises the first hole and an empty space of the second hole surrounded by the inner walls of the insulation spacer.

In one embodiment, the phase change material pattern fills the empty space of the second hole surrounded by the insulation spacer.

In one embodiment, a conductive barrier pattern is formed on the phase change material pattern.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity. In addition, when a layer is described as being formed on another layer or on a substrate, the layer may be formed on the other layer or on the substrate, or a third layer may be interposed between the layer and the other layer or the substrate.

DETAILED DESCRIPTION OF PREFERRED EMBODIMENTS

First Embodiment

Figure 1:
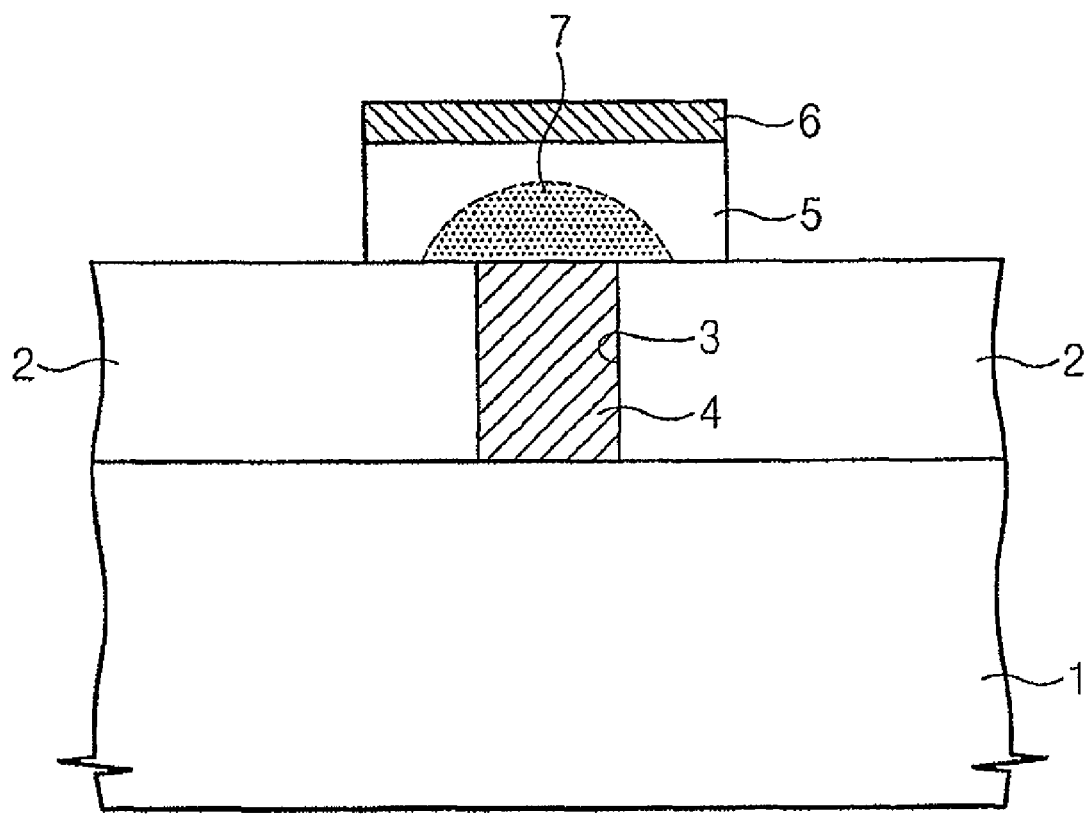
FIG. 1 is a cross-sectional diagram illustrating a data storing medium of a conventional phase change memory cell.
Figure 2A:
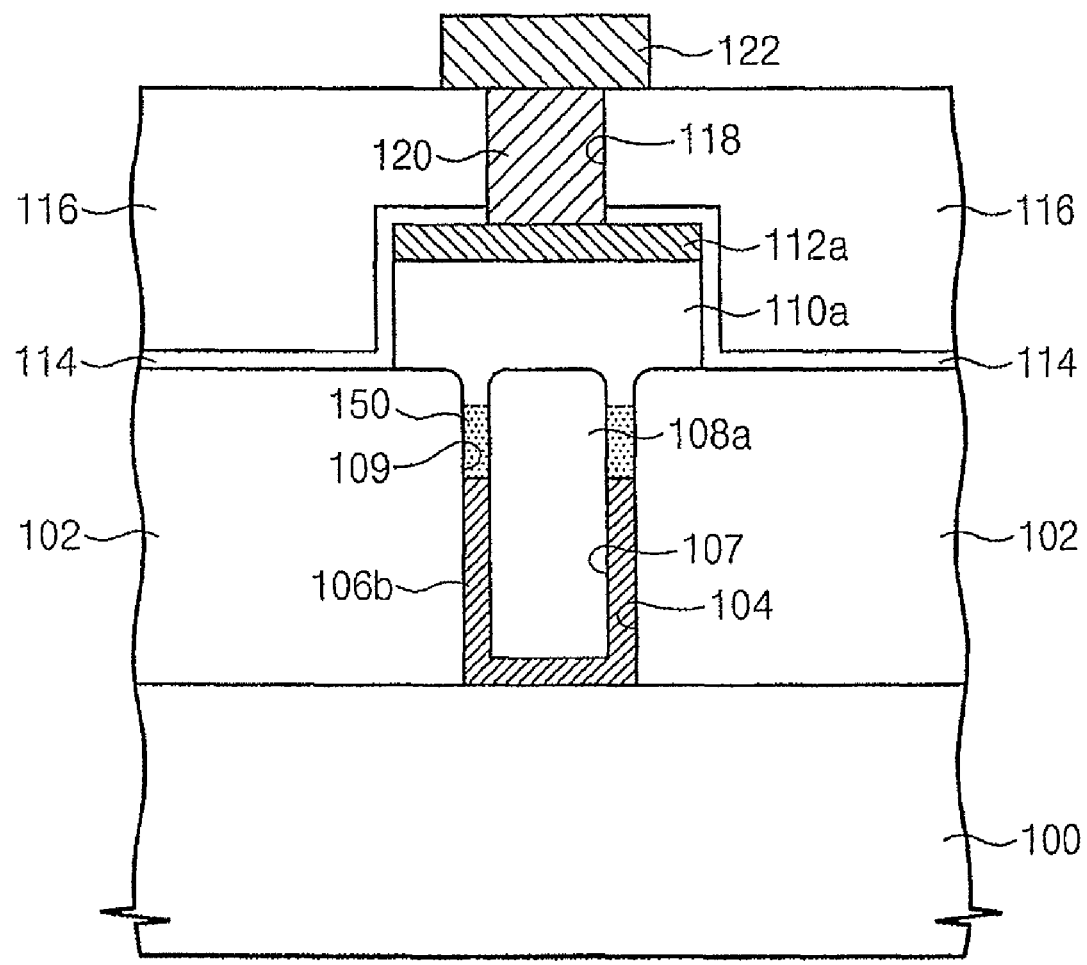
FIG. 2A is a cross-sectional diagram illustrating a phase change memory device in accordance with a first embodiment of the present invention.

FIG. 2A is a cross-sectional diagram illustrating a phase change memory device in accordance with a first embodiment of the present invention.

As illustrated in FIG. 2A, a mold layer 102 made of an insulation film is disposed on a semiconductor substrate 100 (referred to as 'substrate'). The mold layer 102 has an opening 104 exposing a predetermined region of the substrate 100. The opening 104 is formed in a hole shape.

A substantially cylindrical heating electrode 106b is disposed in the opening 104. The heating electrode 106b has its bottom portion contact the exposed substrate 100 and its sidewalls conformally disposed on the lower inner walls of the opening 104. The sidewalls of the heating electrode 106b are disposed along the circumference of the inner walls of the opening 104. Accordingly, the top surfaces of the sidewalls of the heating electrode 106b are lower than the top surface of the mold layer 102. A filling insulation pattern 108a is disposed at an empty region 107 surrounded by the sidewalls of the heating electrode 106b. The filling insulation pattern 108a is upwardly extended so that its top surface can have the same height as that of the top surface of the mold layer 102. Therefore, the opening 104 is partially empty. That is, defined is a gap region 109 surrounded by the upper inner walls of the opening 104 and the outer walls of the extended part of the filling insulation pattern 108. The top surfaces of the sidewalls of the heating electrode 106b correspond to the bottom surface of the gap region 109.

A phase change material pattern 110a is disposed on the mold layer 102. The phase change material pattern 110a is downwardly extended to fill the empty part of the opening 104 (namely, the gap region 109). Accordingly, the phase change material pattern 110a is electrically connected to the top surfaces of the sidewalls of the heating electrode 106b. Since the mold layer 102 contacts the phase change material pattern 110a, the mold layer 102 is preferably made of an insulation film having low reactivity with the phase change material pattern 110a. For example, the mold layer 102 is made of a silicon nitride film or a silicon nitride oxide film.

Preferably, the heating electrode 106b is made of a conductive film having very low reactivity with the phase change material pattern 110a. For example, the heating electrode 106b is made of conductive metal nitride such as titanium nitride, tantalum nitride, tungsten nitride or aluminum titanium nitride. Preferably, the filling insulation pattern 108a is made of an insulation film having an excellent gap fill property. Preferably, the filling insulation pattern 108a is made of an insulation film having low reactivity with the phase change material pattern 110a. In addition, the filling insulation pattern 108a can have an etch selection ratio to the mold layer 102 and/or the heating electrode 106b. For example, the filling insulation pattern 108a can be made of $Al_2O_3$ or $TiO_2$ by atomic layer deposition. Preferably, the phase change material pattern 110a is made of a compound containing at least one of Te and Se that are chalcogenide elements.

Preferably, the top edges of the opening 104 and the top edges of the filling insulation pattern 108a are curved. Therefore, the phase change material pattern 110a can easily fill the gap region 109.

A conductive barrier pattern 112a can be disposed on the phase change material pattern 110a. The conductive barrier pattern 112a has its sidewalls aligned on the sidewalls of the phase change material pattern 110a. Preferably, the conductive barrier pattern 112a is made of a conductive material having very low reactivity with the phase change material pattern 110a. Accordingly, the conductive barrier pattern 112a protects the top surface of the phase change material pattern 110a. For example, the conductive barrier pattern 112a is made of a conductive metal nitride such as titanium nitride, tantalum nitride, tungsten nitride or aluminum titanium nitride.

A capping insulation film 114 conformally covers the mold layer 102, the phase change material pattern 110a and the conductive barrier pattern 112a. An upper interlayer insulation film 116 is disposed on the capping insulation film 114. The capping insulation film 114 covers the sidewalls of the phase change material pattern 110a. The capping insulation film 114 is made of an insulation film having low reactivity with the phase change material pattern 110a, such as a silicon nitride film or a silicon oxide nitride film. The upper interlayer insulation film 116 can be made of a silicon oxide film. In this case, the capping insulation film 114 protects the sidewalls of the phase change material pattern 110a.

Alternatively, the upper interlayer insulation film 116 can be made of an insulation film having low reactivity with the phase change material pattern 110a, such as a silicon nitride film or a silicon oxide nitride film. Here, the capping insulation film 114 can be omitted.

A wire plug 120 is disposed in a wire contact hole 118 exposing the conductive barrier pattern 112a through the upper interlayer insulation film 116 and the capping insulation film 114. A wire 122 electrically connected to the wire plug 120 is disposed on the upper interlayer insulation film 116. The wire plug 120 can be the part of the wire 122 downwardly extended to fill the wire contact hole 118. The conductive barrier pattern 112a can reduce a contact resistance between the wire plug 120 and the phase change material pattern 110a. That is, the conductive barrier pattern 112a contacts the whole top surface of the phase change material pattern 110a, and the wire plug 120 contacts the conductive barrier pattern 112a, thereby reducing the resistance by the contact area between the wire plug 120 and the phase change material pattern 110a. The wire 122 and the wire plug 120 are made of conductive films. For example, the wire 122 and the wire plug 120 can be made of W, Cu or Al.

In the phase change memory device described above, the heating electrode 106b is disposed in the opening 104 in a substantially cylindrical shape lower than the top surface of the mold layer 102. The phase change material pattern 110a contacts the top surfaces of the sidewalls of the heating electrode 106b. That is, the contact area between the phase change material pattern 110a and the heating electrode 106b corresponds to the area of the top surfaces of the sidewalls of the heating electrode 106b. Thus, the contact area between the phase change material pattern 110a and the heating area 106b is considerably reduced, to decrease the amount of the operation current of the phase change memory device.

In addition, the phase change material pattern 110a is extended into the opening 104 to contact the heating electrode 106b. Therefore, a program region 150 of the phase change material pattern 110a is defined by the upper inner walls of the opening 104, and thus has a reduced volume. Specifically, the phase change material pattern 110a fills the gap region 109, and thus the program region 150 is positioned in the gap region 109. That is, the program region 150 is defined by the outer walls of the extended part of the filling insulation pattern 108a as well as the upper inner walls of the opening 104, and thus has a reduced volume. The program region 150 has a much smaller volume than the conventional hemispherical program region. As a result, the heat that must be supplied to the program region 150 in the program or erase operation is reduced, and thus the amount of the operation current of the phase change memory device is remarkably reduced.

That is, the contact area between the phase change material pattern 110a and the heating electrode 106b is reduced and the volume of the program region 150 is reduced, to minimize the amount of the operation current. Accordingly, the phase change memory device achieves high integration and low power consumption.

The filling insulation pattern 108a can be formed in various shapes, which will now be described with reference to FIGS. 2B and 2C.

Figure 2B:
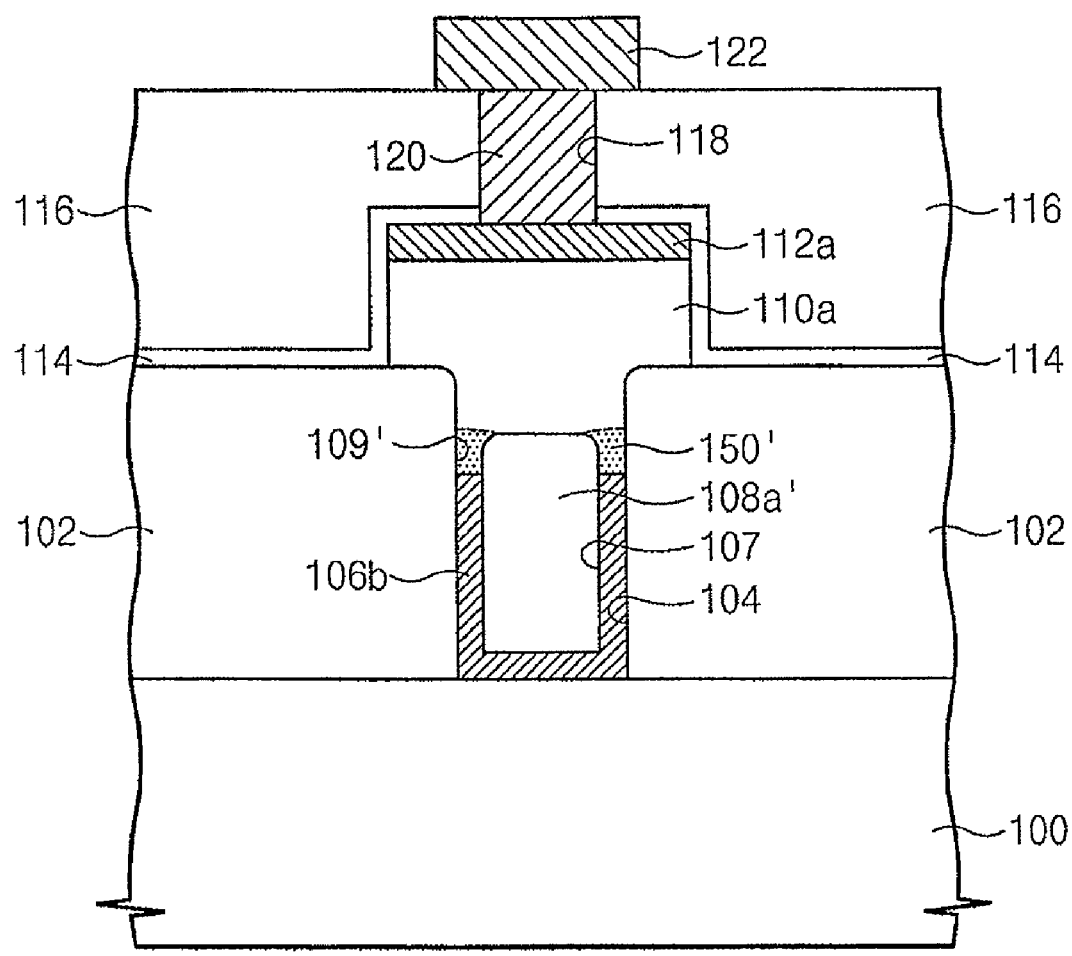
FIG. 2B is a cross-sectional diagram illustrating one modified example of the phase change memory device in accordance with the first embodiment of the present invention.

FIG. 2B is a cross-sectional diagram illustrating one modified version of the phase change memory device in accordance with the first embodiment of the present invention.

As shown in FIG. 2B, a filling insulation pattern 108a' fills an empty region 107 surrounded by sidewalls of a heating electrode 106b, and is upwardly extended. Here, the top surface of the filling insulation pattern 108a' is higher than the top surfaces of the sidewalls of the heating electrode 106b and lower than a top surface of a mold layer 102. Preferably, the top edges of the filling insulation pattern 108a' are curved, and top edges of an opening 104 are curved.

A phase change material pattern 110a is disposed on the mold layer 102. The phase change material pattern 110a is downwardly extended to fill the empty part of the opening 104. Here, the empty part of the opening 104 includes a gap region 109' and the empty space of the opening 104 on the filling insulation pattern 108a. The gap region 109' is surrounded by the outer walls of the extended part of the filling insulation pattern 108' and the upper inner walls of the opening 104. The top surfaces of the sidewalls of the heating electrode 106b correspond to the bottom surface of the gap region 109'.

Since the top surface of the filling insulation pattern 108a' is lower than the top surface of the mold layer 102, the aspect ratio of the gap region 109' is reduced. Accordingly, the phase change material pattern 110a can easily fill the gap region 109'. In addition, a program region 150' of the phase change material pattern 110a is defined by the upper sidewalls of the opening 104 and the sidewalls of the extended part of the filling insulation pattern 108', and thus has a much smaller volume than the conventional one.

Figure 2C:
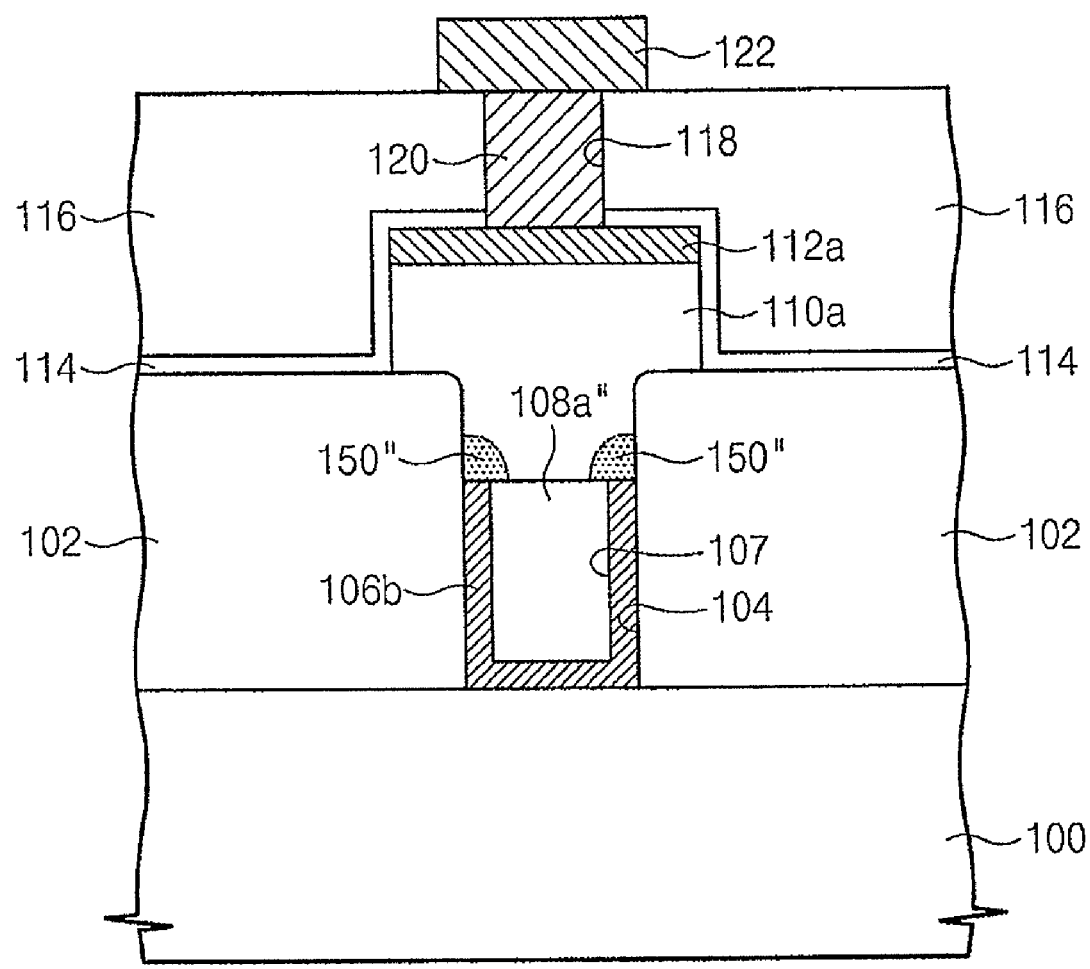
FIG. 2C is a cross-sectional diagram illustrating another modified example of the phase change memory device in accordance with the first embodiment of the present invention.

FIG. 2C is a cross-sectional diagram illustrating another modified version of the phase change memory device in accordance with the first embodiment of the present invention.

As depicted in FIG. 2C, a filling insulation pattern 108a" fills an empty region 107 surrounded by sidewalls of a heating electrode 106b. Here, the top surface of the filling insulation pattern 108a" has the same height as that of the top surfaces of the sidewalls of the heating electrode 106b.

A phase change material pattern 110a disposed on a mold layer 102 is downwardly extended to fill an empty part of an opening 104. The empty part of the opening 104 corresponds to the empty space of the opening 104 positioned on the heating electrode 106b and the filling insulation pattern 108a".

Since the top surface of the filling insulation pattern 108a" has the same height as that of the top surfaces of the sidewalls of the heating electrode 106b, the aspect ratio of the empty part of the opening 104 is reduced. Therefore, the phase change material pattern 110a can easily fill the empty part of the opening 104.

In addition, a program region 150" of the phase change material pattern 110a is defined by the upper sidewalls of the opening 104, and thus has a much smaller volume than the conventional one. As a result, the amount of operation current is minimized.

The method for forming the phase change memory devices described above will now be described in detail.

FIGS. 3 to 7 are cross-sectional diagrams illustrating sequential steps of one embodiment of a method for forming the phase change memory device of FIG. 2A.

Figure 3:
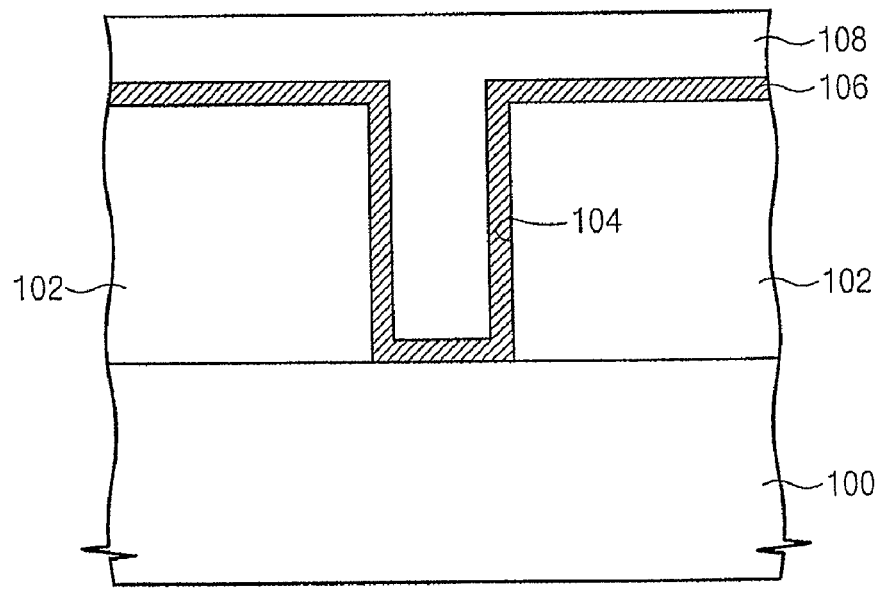
FIGS. 3 to 7 are cross-sectional diagrams illustrating sequential steps of a method for forming the phase change memory device of FIG. 2A.

Referring to FIG. 3, the mold layer 102 is formed on the substrate 100. The opening 104 exposing the predetermined region of the substrate 100 is formed by patterning the mold layer 102. The opening 104 is formed in a hole shape. The mold layer 102 is made of an insulation film.

An electrode conductive film 106 is formed on the whole surface of the substrate 100 having the opening 104. The electrode conductive film 106 is formed along the inner walls and bottom surface of the opening 104 and the top surface of the mold layer 102. A filling insulation film 108 for filling the opening 104 is formed on the electrode conductive film 106. Preferably, the electrode conductive film 106 is made of a conductive film having very low reactivity with a phase change material. For example, the electrode conductive film 106 is made of conductive metal nitride such as titanium nitride, tantalum nitride, tungsten nitride or aluminum titanium nitride. Preferably, the filling insulation film 108 is made of an insulation film having an excellent gap fill property. In addition, preferably, the filling insulation film 108 is made of an insulation film having very low reactivity with a phase change material. Furthermore, the filling insulation pattern 108 can have an etch selection property to the mold layer 102 and/or the electrode conductive film 106. For example, the filling insulation film 108 can be made of $Al_2O_3$ or $TiO_2$ by atomic layer deposition. The top surface of the filling insulation film 108 can be planarized.

Figure 4:
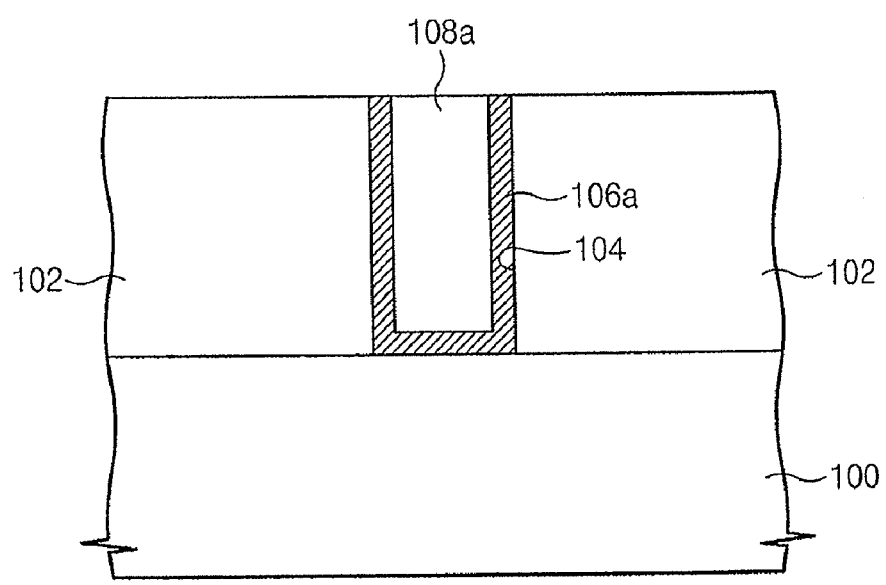

As shown in FIG. 4, a preliminary heating electrode 106a and the filling insulation pattern 108a are sequentially stacked in the opening 104. The filling insulation film 108 and the electrode conductive film 106 are planarized to form a preliminary heating electrode 106a and the filling insulation pattern 108a that are sequentially stacked in the opening 104 until the top surface of the mold layer 102 is exposed. The preliminary heating electrode 106a is formed in a substantially cylindrical shape, having its bottom portion formed on the substrate 100 exposed through the opening 104 and its sidewalls conformally formed on the inner walls of the opening 104. Here, the top surfaces of the sidewalls of the preliminary heating electrode 106a are exposed. A chemical mechanical polishing process or an etch-back process can be used as the planarizing process.

Figure 5:
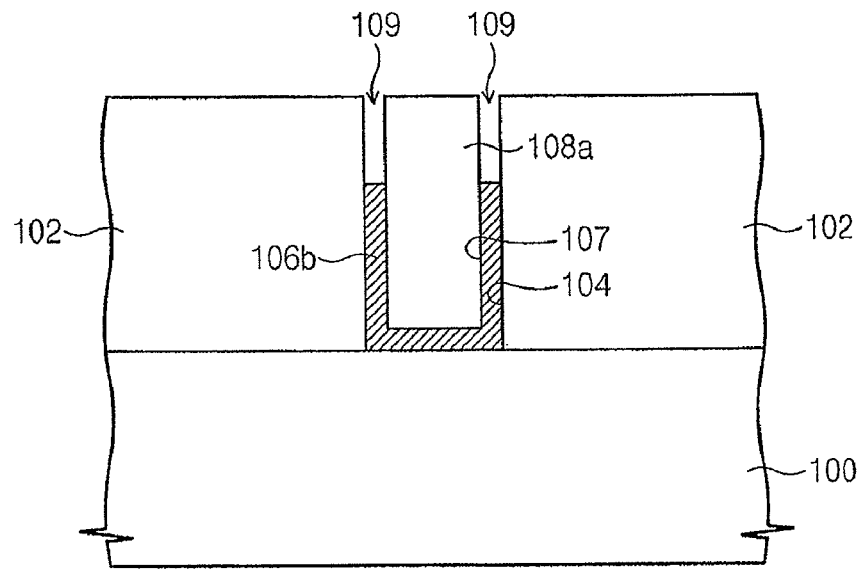

As depicted in FIG. 5, the heating electrode 106b is formed by selectively recessing the exposed surface of the preliminary heating electrode 106a. The sidewalls of the heating electrode 106b are conformally disposed along the circumference of the lower inner walls of the opening 104. The top surface of the filling insulation pattern 108a can be maintained with the same height as that of the mold layer 102, by selectively recessing the preliminary heating electrode 106a by a process such as selective etching. Accordingly, the filling insulation pattern 108a fills the empty region 107 surrounded by the sidewalls of the heating electrode 106b, and is extended higher than the sidewalls of the heating electrode 106b. The gap region 109 is formed by the recess process. The gap region 109 is surrounded by the outer walls of the extended part of the filling insulation pattern 108a, the upper inner walls of the opening 104 and the top surfaces of the sidewalls of the heating electrode 106b.

Figure 6:
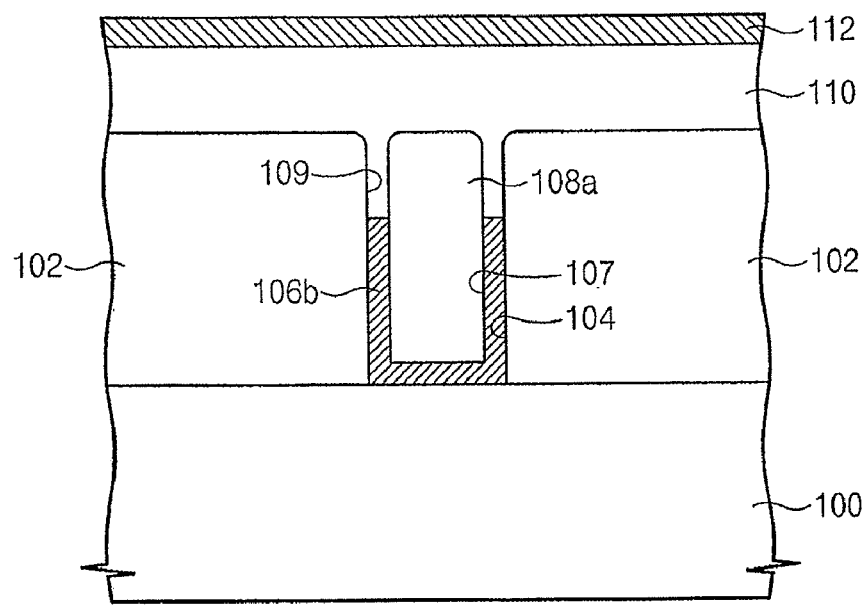

As illustrated in FIG. 6, a phase change material film 110 for filling the empty part of the opening 104, namely, the gap region 109, is formed on the whole surface of the substrate 100. Therefore, the phase change material film 110 is electrically connected to the top surfaces of the sidewalls of the heating electrode 106b. In order to sufficiently fill the gap region 109, the phase change material film 110 is deposited by sputtering and formed by a reflow process. A conductive barrier film 112 is formed on the phase change material film 110.

Before forming the phase change material film 110, the top edges of the gap region 109 (the top edges of the opening 104 and the top edges of the filling insulation pattern 108a) can be curved by performing an RF plasma etching process on the whole surface of the substrate 100 having the gap region 109. As a result, the phase change material film 110 can be easily filled in the gap region 109. A natural oxide film on the exposed surface of the heating electrode 106b can be removed by the RF plasma etching process.

Preferably, the phase change material film 110 is made of a compound containing at least one of Te and Se that are chalcogenide elements. Preferably, the conductive barrier film 112 is made of a conductive film having very low reactivity with the phase change material film 110. For example, the conductive barrier film 112 can be made of conductive metal nitride such as titanium nitride, tantalum nitride, tungsten nitride or aluminum titanium nitride. The mold layer 102 contacts the phase change material film 110. Accordingly, the mold layer 102 is preferably made of an insulation film having very low reactivity with the phase change material film 110, such as a silicon nitride film and/or a silicon oxide nitride film.

Figure 7:
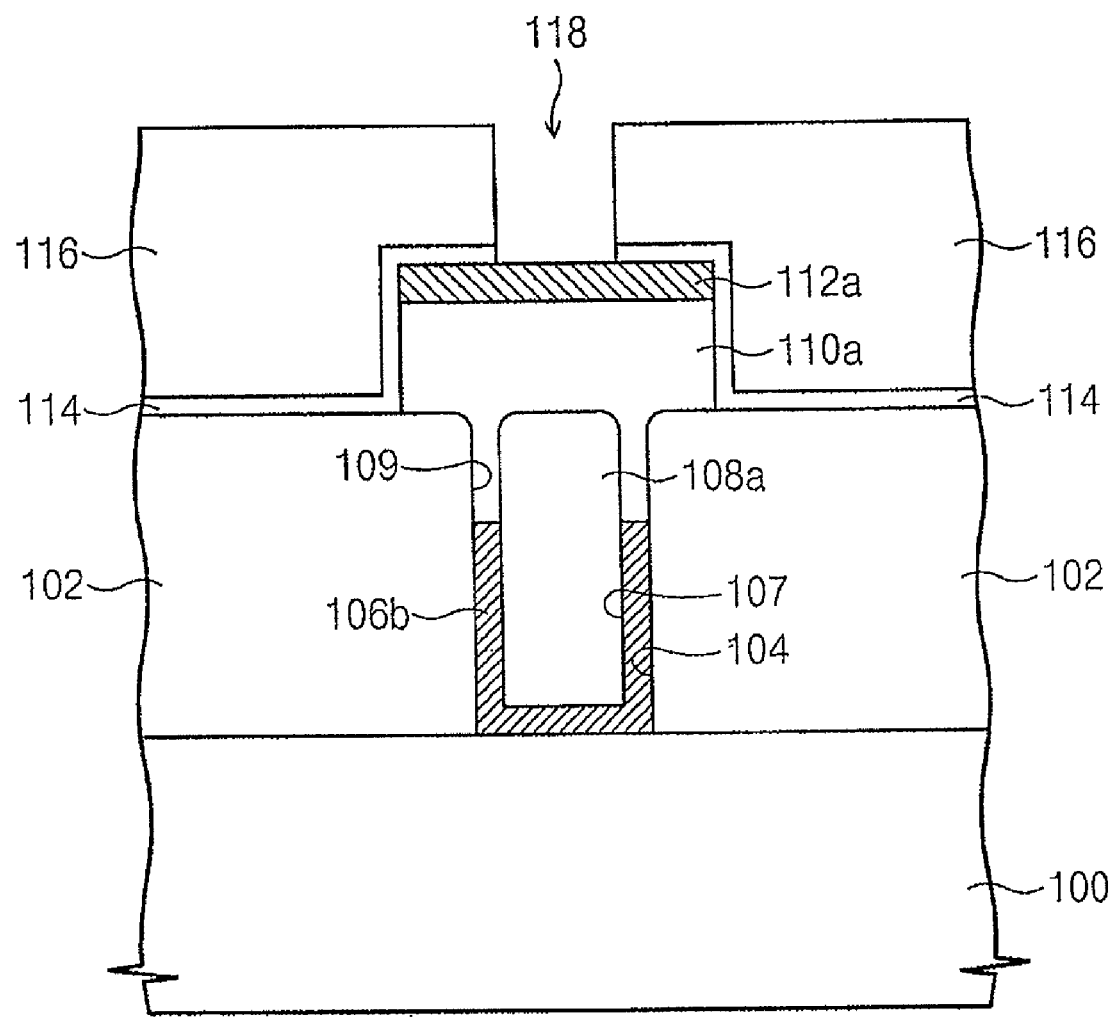

As shown in FIG. 7, the phase change material pattern 110a and the conductive barrier pattern 112a are sequentially stacked by consecutively patterning the conductive barrier film 112 and the phase change material film 110. The phase change material pattern 110a fills the gap region 109, and thus electrically contacts the top surfaces of the sidewalls of the heating electrode 106b. In the patterning process, the conductive barrier film 112 protects the top surface of the phase change material film 110.

When the phase change material pattern 110a is filled in the empty part of the opening 104 (namely, the gap region 109), the phase change material pattern 110a is self-aligned with the sidewalls of the heating electrode 106b. Thus, the phase change material pattern 110a can be easily connected to the top surfaces of the sidewalls of the heating electrode 106b. In addition, the volume of the program region of the phase change material pattern 110a is remarkably reduced by the gap region 109. As a result, the process for connecting the phase change material pattern 110a and the heating electrode 106b can be simplified, and the operation current of the phase change memory device can be minimized.

The capping insulation film 114 and the upper interlayer insulation film 116 are sequentially formed on the whole surface of the substrate 100. The upper interlayer insulation film 116 can be made of a silicon oxide film. In this case, preferably, the capping insulation film 114 is made of an insulation film having low reactivity with the phase change material pattern 110a, such as a silicon nitride film or a silicon oxide nitride film.

Alternatively, the upper interlayer insulation film 116 can be made of an insulation film having low reactivity with the phase change material pattern 110a, such as a silicon nitride film or a silicon oxide nitride film. Here, the capping insulation film 114 can be omitted.

The wire contact hole 118 exposing the conductive barrier pattern 112a is formed by consecutively patterning the upper interlayer insulation film 116 and the capping insulation film 114.

Thereafter, the wire plug 120 and the wire 122 are formed as shown in FIG. 2A.

The method for forming the phase change memory device of FIG. 2B will now be described. The procedure to the step for forming the preliminary heating electrode 106a and the filling insulation pattern 108a is performed as described in connection with FIGS. 3 and 4.

Figure 8:
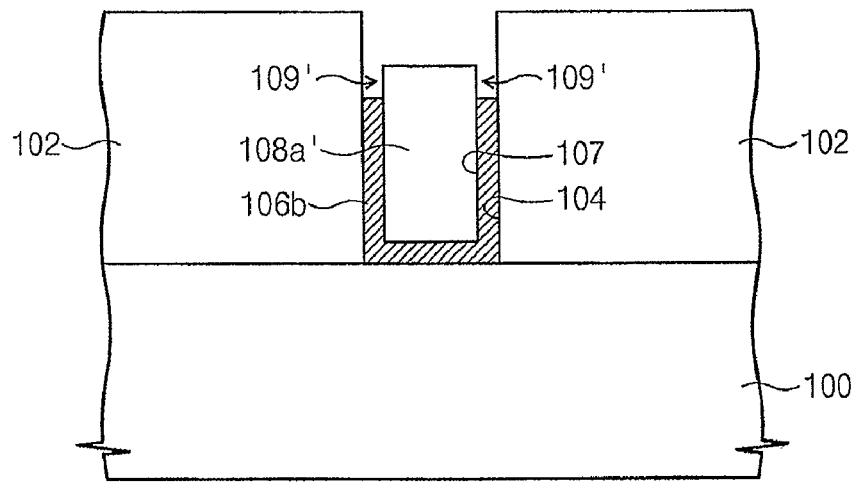
FIGS. 8 and 9 are cross-sectional diagrams illustrating sequential steps of a method for forming the phase change memory device of FIG. 2B.
Figure 9:
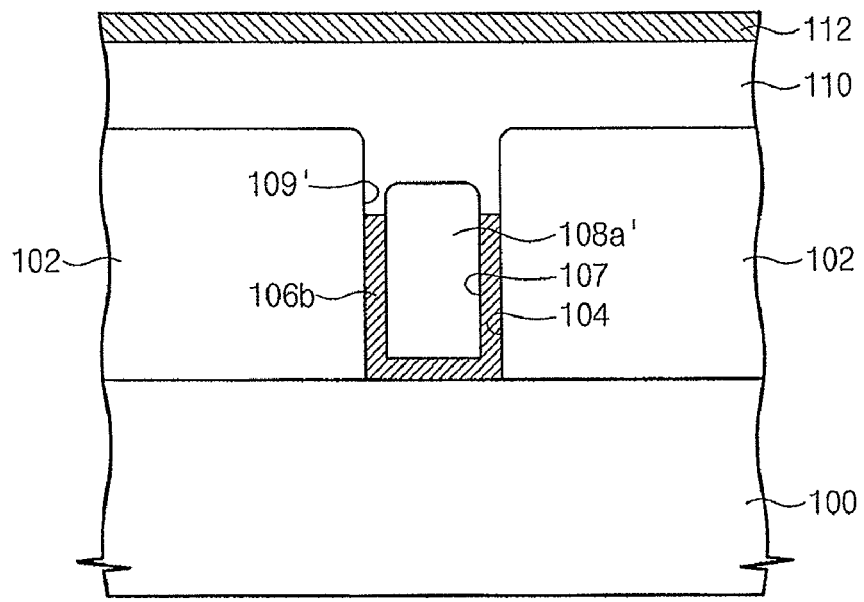

FIGS. 8 and 9 are cross-sectional diagrams illustrating sequential steps of one embodiment of a method for forming the phase change memory device of FIG. 2B.

Referring to FIGS. 4 and 8, the heating electrode 106b and the recessed filling insulation pattern 108a' are formed by recessing the preliminary heating electrode 106a and the filling insulation pattern 108a. Here, the top surface of the recessed filling insulation pattern 108a' is lower than the top surface of the mold layer 102 and higher than the top surfaces of the sidewalls of the heating electrode 106b. After the heating electrode 106b is formed by recessing the preliminary heating electrode 106a by a process such as selective etching, the filling insulation pattern 108a can be recessed by a process such as selective etching. Conversely, after the filling insulation pattern 108a is recessed, the preliminary heating electrode 106a can be recessed.

The recessed filling insulation pattern 108a' fills the empty region 107 surrounded by the sidewalls of the heating electrode 106b, and is extended higher than the sidewalls of the heating electrode 106b. The opening 104 is partially emptied by the recess processes. The empty part of the opening 104 includes the gap region 109' and the empty space of the opening 104 on the recessed filling insulation pattern 108a'. The gap region 109' is surrounded by the outer walls of the extended part of the recessed filling insulation pattern 108a', the upper inner walls of the opening 104 and the top surfaces of the sidewalls of the heating electrode 106b.

As illustrated in FIG. 9, a phase change material film 110 for filling the empty part of the opening 104 is formed on the whole surface of the substrate 100, and a conductive barrier film 112 is formed on the phase change material film 110. The subsequent processes are performed as shown in FIG. 7.

Before forming the phase change material film 110, an RF plasma etching process can be performed on the whole surface of the substrate 100. Accordingly, the top edges of the opening 104 and the top edges of the recessed filling insulation pattern 108a' are curved. As a result, the phase change material film 100 can easily fill the empty part of the opening 104. In addition, the RF plasma etching process can remove a natural oxide film that may be formed on the exposed surface of the heating electrode 106b.

Since the top surface of the recessed filling insulation pattern 108a' is lower than the top surface of the mold layer 102, the aspect ratio of the gap region 109' is reduced. Therefore, the phase change material film 110 can easily fill the empty part of the opening 104.

One embodiment of a method for forming the phase change memory device of FIG. 2C will now be described with reference to FIGS. 10 and 11. The procedure to the step for forming the preliminary heating electrode 106a and the filling insulation pattern 108a is performed as described in connection with FIGS. 3 and 4.

Figure 10:
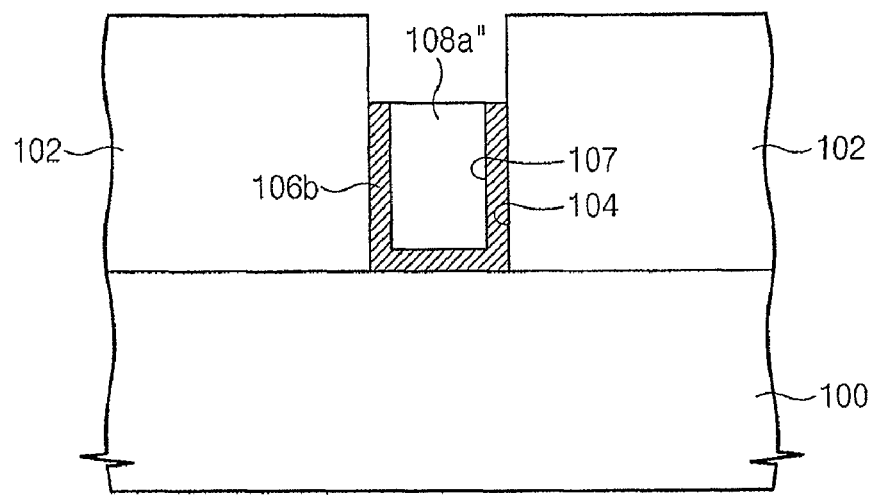
FIGS. 10 and 11 are cross-sectional diagrams illustrating sequential steps of a method for forming the phase change memory device of FIG. 2C.
Figure 11:
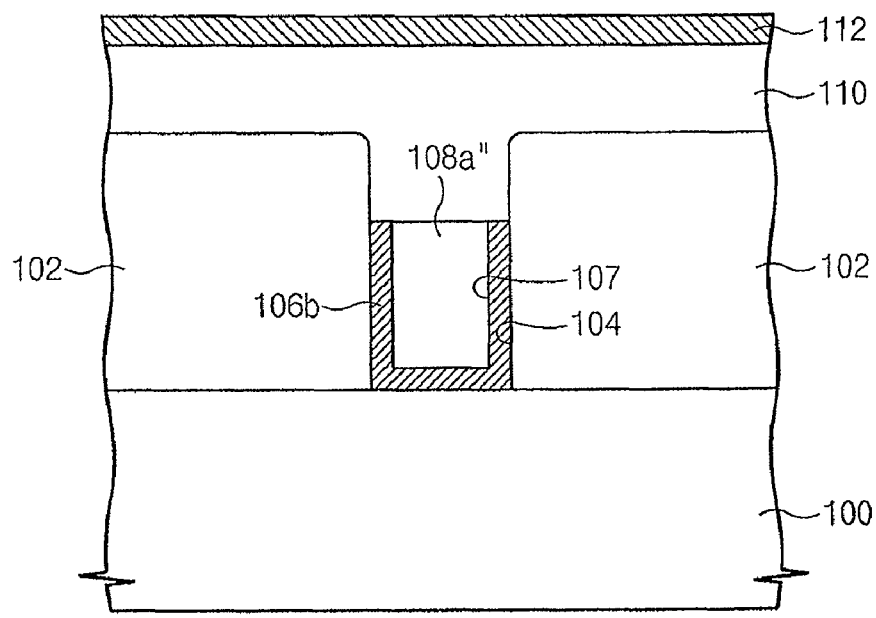

FIGS. 10 and 11 are cross-sectional diagrams illustrating sequential steps of the method for forming the phase change memory device of FIG. 2C.

As depicted in FIGS. 3 and 10, the heating electrode 106b and the recessed filling insulation pattern 108a" are formed by recessing the preliminary heating electrode 106a and the filling insulation pattern 108a by a process such as selective etching. Here, the top surface of the recessed filling insulation pattern 108a" has the same height as that of the top surfaces of the sidewalls of the heating electrode 106b. Therefore, the opening 104 is partially emptied. The empty part of the opening 104 is the empty space of the opening 104 positioned on the heating electrode 106b and the recessed filling insulation pattern 108a". In this case, the gap regions 109 and 109' of FIGS. 2A and 2B are not formed.

After the heating electrode 106b is formed by recessing the preliminary heating electrode 106a, the filling insulation pattern 108a can be recessed. Conversely, after the filling insulation pattern 108a is recessed, the heating electrode 106b can be formed by recessing the preliminary heating electrode 106a. In addition, the heating electrode 106b and the recessed filling insulation pattern 108a" can be formed at the same time. That is, the recess process can be performed by using an etch recipe having the same etch ratio to the preliminary heating electrode 106a and the filling insulation pattern 108a, and having an etch selection property to the mold layer 102.

Referring to FIG. 10, a phase change material film 110 for filling the empty part of the opening 104 is formed on the whole surface of the substrate 100, and a conductive barrier film 112 is formed on the phase change material film 110. The subsequent processes are performed as shown in FIG. 7.

Before forming the phase change material film 110, an RF plasma etching process can be performed on the whole surface of the substrate 100. Accordingly, the top edges of the opening 104 can be curved.

The aspect ratio of the empty part of the opening 104 can be more reduced by the recessed filling insulation pattern 108a". As a result, the phase change material film 110 can easily fill the empty part of the opening 104.

Second Embodiment

A property of a phase change memory device in accordance with a second embodiment of the present invention is a shape of an opening passing through a mold layer.

Figure 12:
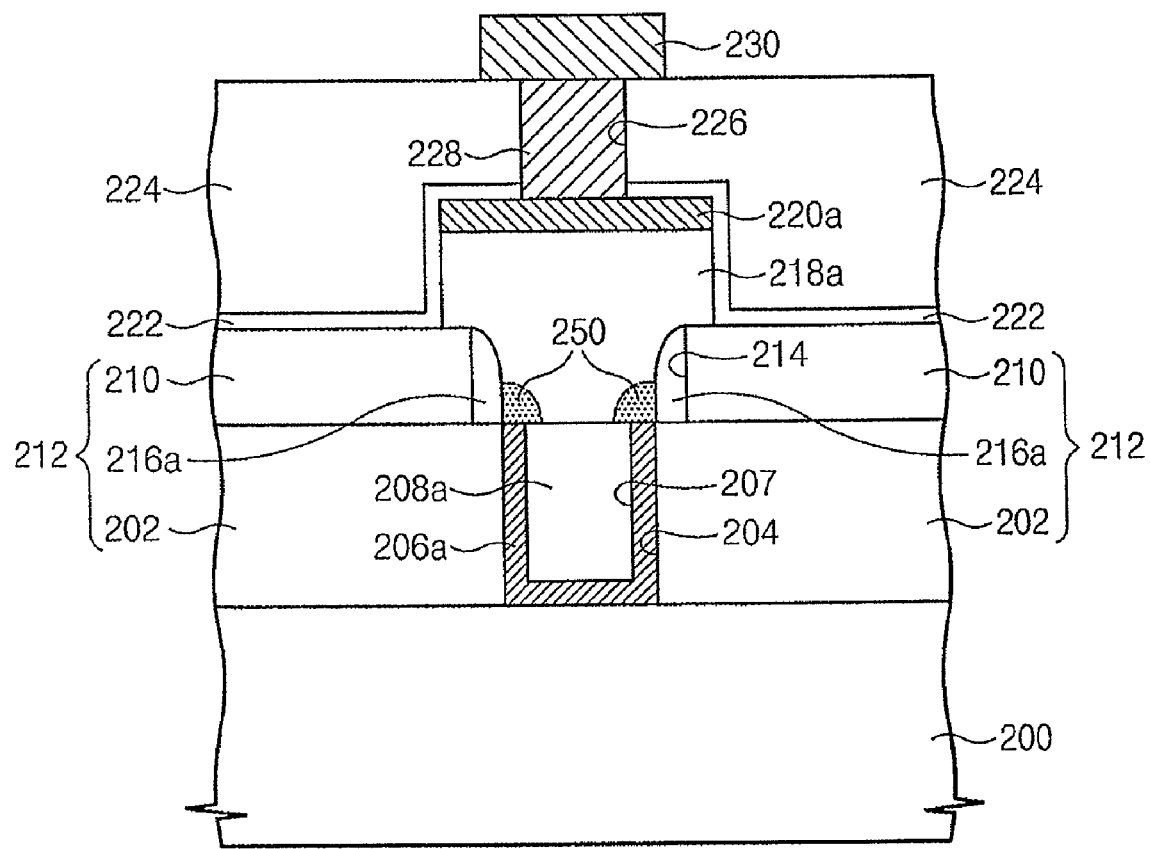
FIG. 12 is a cross-sectional diagram illustrating a phase change memory device in accordance with a second embodiment of the present invention.

FIG. 12 is a cross-sectional diagram illustrating the phase change memory device in accordance with the second embodiment of the present invention.

As illustrated in FIG. 12, a mold layer 212 is disposed on a substrate 200. The mold layer 212 includes a lower insulation layer 202, an upper insulation layer 210 and an insulation spacer 216a. The lower insulation layer 202 is disposed on the substrate 200 with a first hole 204. The first hole 204 exposes a predetermined region of the substrate 200 through the lower insulation layer 202. The upper insulation layer 210 is disposed on the lower insulation layer 202. The upper insulation layer 210 has a second hole 214. The second hole 214 is aligned on the first hole 204 through the upper insulation layer 210. The first and second holes 204 and 214 are linked to each other. The second hole 214 has a larger width than the first hole 204. The insulation spacer 216a is disposed on the inner walls of the second hole 214. The bottom surface of the insulation spacer 216a contacts the top surface of the lower insulation layer 202. The inner walls of the insulation spacer 216a are aligned on the inner walls of the first hole 204. The inner walls of the insulation spacer 216a are curved.

The first hole 204 and the empty space of the second hole 214 surrounded by the insulation spacer 216a correspond to the opening exposing the substrate 100 through the mold layer 212.

The lower insulation layer 202 can be made of a silicon oxide film, a silicon nitride film or a silicon oxide nitride film. Preferably, the upper insulation layer 210 is made of an insulation film having an etch selection ratio to the lower insulation layer 202. Preferably, the upper insulation layer 210 is made of an insulation film having very low reactivity with a phase change material. For example, when the lower insulation layer 202 is made of a silicon oxide film, the upper insulation layer 210 can be made of a silicon nitride film or a silicon oxide nitride film. Alternatively, the lower insulation layer 202 can be made of a silicon oxide nitride film and the upper insulation layer 210 can be made of a silicon nitride film. In addition, the lower insulation layer 202 can be made of a silicon nitride film and the upper insulation layer 210 can be made of a silicon oxide nitride film.

Preferably, the insulation spacer 216a is made of an insulation film having an etch selection ratio to the lower insulation layer 202. Preferably, the insulation spacer 216a is made of an insulation film having very low reactivity with a phase change material. When the lower insulation layer 202 is made of a silicon oxide film, the insulation spacer 216a can be made of a silicon nitride film or a silicon oxide nitride film. Alternatively, the lower insulation layer 202 can be made of a silicon nitride film and the insulation spacer 216a can be made of a silicon oxide nitride film. In addition, the lower insulation layer 202 can be made of a silicon oxide nitride film and the insulation spacer 216a can be made of a silicon oxide film. The insulation spacer 216a and the upper insulation layer 210 can be made of the same material. The insulation spacer 216a can have an etch selection ratio to the upper insulation layer 210.

A heating electrode 206a and a filling insulation pattern 208a are sequentially disposed in the first hole 204. The heating electrode 206a is formed in a substantially cylindrical shape. That is, the heating electrode 206a has its bottom portion conformally formed on the exposed substrate 200 and its sidewalls conformally formed on the inner walls of the first hole 204. The filling insulation pattern 208a fills an empty region 207 surrounded by the sidewalls of the heating electrode 206a. Preferably, the top surface of the filling insulation pattern 208a has the same height as that of the top surfaces of the sidewalls of the heating electrode 206a. Since the inner walls of the insulation spacer 216a are aligned on the inner walls of the first hole 204, the top surfaces of the sidewalls of the heating electrode 206a are exposed.

A phase change material pattern 218a for filling the empty part of the opening is disposed on the mold layer 212. The empty part of the opening corresponds to the empty space of the second hole 214 surrounded by the insulation spacer 216a. Therefore, the phase change material pattern 218a contacts the top surfaces of the sidewalls of the heating electrode 206a. In addition, a program region 250 of the phase change material pattern 218a is defined by the inner walls of the insulation spacer 216a, and thus has a smaller volume than a conventional one. As a result, the amount of the operation current of the phase change memory device can be minimized by reducing the contact area between the phase change material pattern 218a and the heating electrode 206a, and reducing the volume of the program region 250 of the phase change material pattern 218a. Thus, the phase change memory device can achieve the high integration and/or low power consumption.

Preferably, the phase change material pattern 218a is made of an insulation film having an excellent gap fill property. Preferably, the filling insulation pattern 208a is made of an insulation film having low reactivity with the phase change material pattern 218a. In addition, the filling insulation pattern 208a can have an etch selection ratio to the mold layer 212 and/or the heating electrode 206a. For example, the filling insulation pattern 208a can be made of $Al_2O_3$ or $TiO_2$ by atomic layer deposition. Preferably, the heating electrode 206a is made of a conductive material having low reactivity with the phase change material pattern 218a. For example, the heating electrode 206a can be made of conductive metal nitride such as titanium nitride, tantalum nitride, tungsten nitride or aluminum titanium nitride. Preferably, the phase change material pattern 218a is made of a compound containing at least one of Te and Se that are chalcogenide elements.

A conductive barrier pattern 220a is disposed on the phase change material pattern 218a. The conductive barrier pattern 220a has its sidewalls aligned on the sidewalls of the phase change material pattern 218a. Preferably, the conductive barrier pattern 220a is made of a conductive material having low reactivity with the phase change material pattern 218a. For example, the conductive barrier pattern 220a can be made of conductive metal nitride such as titanium nitride, tantalum nitride, tungsten nitride or aluminum titanium nitride.

A capping insulation film 222 and an upper interlayer insulation film 224 are disposed to cover the phase change material pattern 218a and the conductive barrier pattern 220a. If necessary, the capping insulation film 222 can be omitted. The capping insulation film 222 and the upper interlayer insulation film 224 can be made of the same materials as those of the capping insulation film 114 and the upper interlayer insulation film 116 of FIG. 2A, and operated in the same manner.

A wire plug 228 is disposed in a wire contact hole 226 exposing the conductive barrier pattern 220a through the upper interlayer insulation film 224 and the capping insulation film 222, and a wire 230 electrically connected to the wire plug 228 is disposed on the upper interlayer insulation film 224. The wire plug 228 and the wire 230 can be made of W, Cu or Al.

FIGS. 13 to 16 are cross-sectional diagrams illustrating sequential steps of one embodiment of a method for forming the phase change memory device of FIG. 12.

Figure 13:
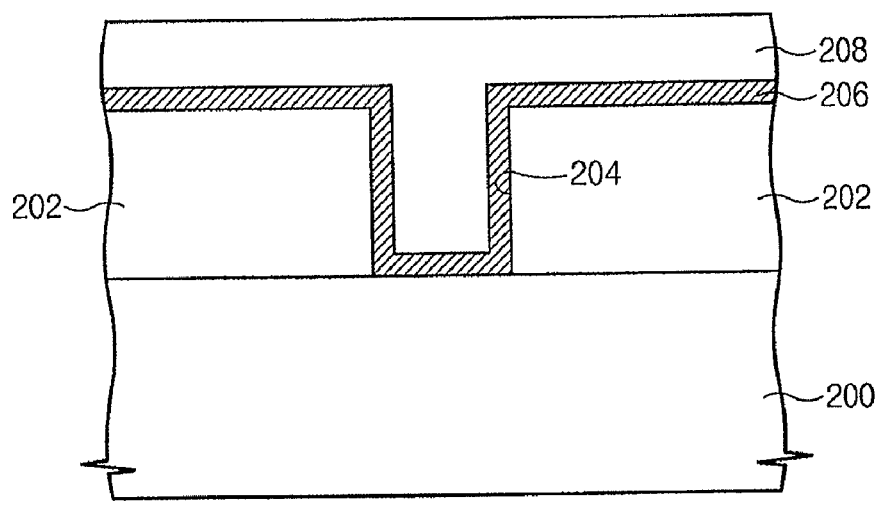
FIGS. 13 to 16 are cross-sectional diagrams illustrating sequential steps of a method for forming the phase change memory device of FIG. 12.

Referring to FIG. 13, the lower insulation layer 202 is formed on the substrate 100. The first hole 204 exposing the predetermined region of the substrate 100 is formed by patterning the lower insulation layer 202. An electrode conductive film 206 is conformally formed on the whole surface of the substrate 100 having the first hole 204. A filling insulation film 208 for filling the first hole 204 is formed on the electrode conductive film 206.

Figure 14:
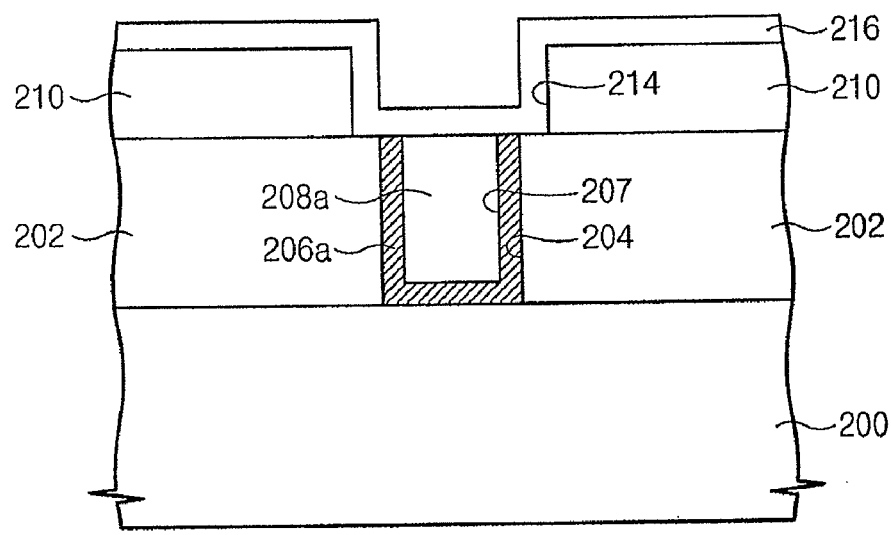

As shown in FIG. 14, the filling insulation film 208 and the electrode conductive film 206 are planarized to form the heating electrode 206a and the filling insulation pattern 208a are sequentially stacked in the first hole 204 until the top surface of the lower insulation layer 202 is planarized. The heating electrode 206a is formed in a substantially cylindrical shape, and the filling insulation pattern 208a fills the empty space 207 surrounded by the sidewalls of the heating electrode 206a. The filling insulation film 208 and the electrode conductive film 206 can be planarized by a chemical mechanical polishing process or an etch-back process.

The upper insulation layer 210 is formed on the whole surface of the substrate 100. The second hole 214 exposing the heating electrode 206a and the filling insulation pattern 208a is formed by patterning the upper insulation layer 210. The second hole 214 has a larger width than the first hole 204. The second hole 214 is aligned with and linked to the first hole 204.

An insulation spacer film 216 is conformally formed on the whole surface of the structure.

Figure 15:
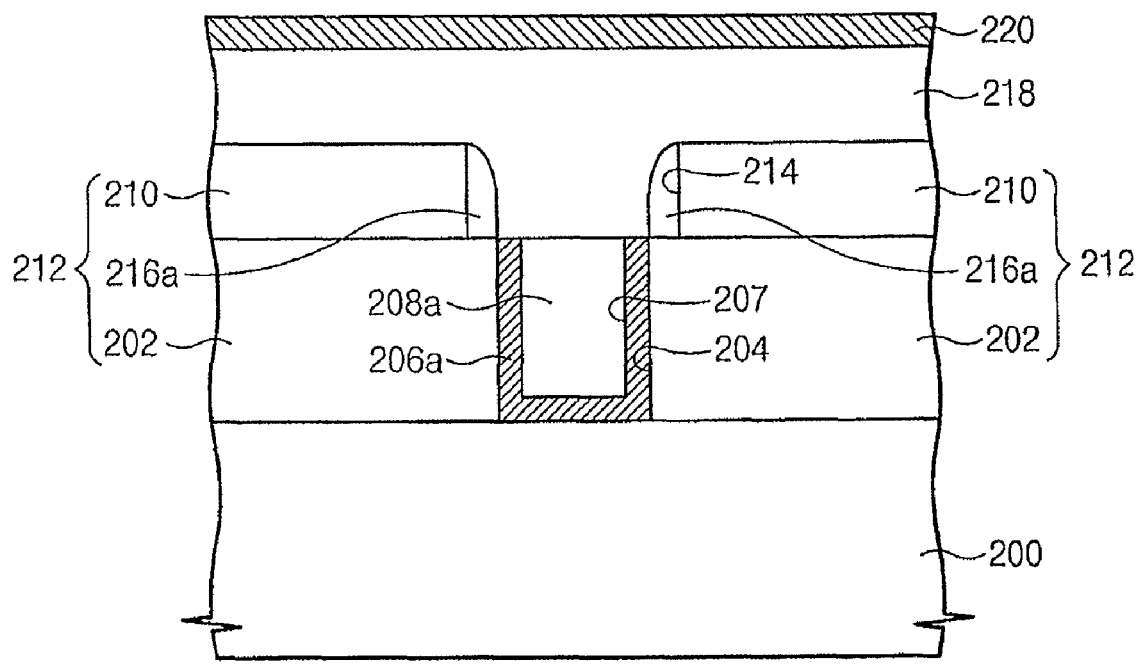

As illustrated in FIG. 15, the insulation spacer 216a is formed on the inner walls of the second hole 214 by anisotropically etching the whole surface of the insulation spacer film 216. Here, the top surfaces of the sidewalls of the heating electrode 206a and the top surface of the filling insulation pattern 208a are exposed. When the insulation spacer 216a is formed, the heating electrode 206a and the filling insulation pattern 208a are exposed by controlling the thickness of the insulation spacer film 216. The inner walls of the insulation spacer 216a are aligned on the inner walls of the first hole 204.

The lower insulation layer 202, the upper insulation layer 210 and the insulation spacer 216a compose the mold layer 212, and the first hole 204 and the empty space of the second hole 214 surrounded by the insulation spacer 216a correspond to the opening passing through the mold layer 212.

A phase change material film 218 is formed on the whole surface of the substrate 100 to fill the empty part of the opening (namely, the empty space of the second hole 214 surrounded by the insulation spacer 216a). The phase change material film 218 can be formed by a sputtering type deposition process or a reflow process. Thereafter, a conductive barrier film 220 is formed on the phase change material film 218.

Figure 16:
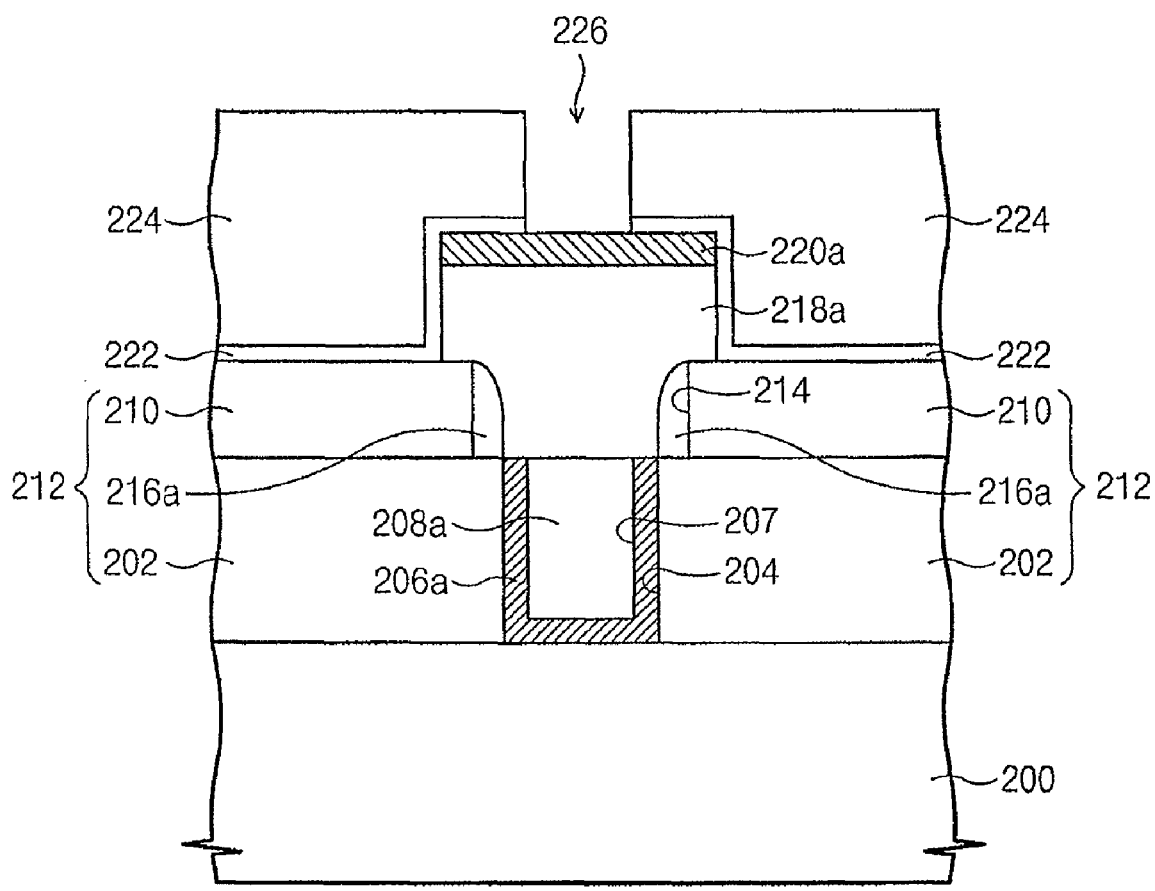

As shown in FIG. 16, the phase change material pattern 218a and the conductive barrier pattern 220a are sequentially stacked by consecutively patterning the conductive barrier film 220 and the phase change material film 218. In the patterning process, the conductive barrier pattern 220a protects the top surface of the phase change material pattern 218a. The phase change material pattern 218a is aligned on the inner walls of the insulation spacer 216a and electrically connected to the top surfaces of the sidewalls of the heating electrode 206a.

The capping insulation film 222 and the upper interlayer insulation film 224 are sequentially formed on the whole surface of the substrate 200. If necessary, the capping insulation film 222 can be omitted. The wire contact hole 226 exposing the conductive barrier pattern 220a is formed by consecutively patterning the upper interlayer insulation film 224 and the capping insulation film 222.

Thereafter, the wire plug 228 and the wire 230 are formed as shown in FIG. 12.

In the first and second embodiments of the present invention, the equivalent elements can be made of the same materials.

As discussed earlier, in accordance with the present invention, the heating electrode is formed in a substantially cylindrical shape on the lower sidewalls of the opening, and the phase change material pattern is downwardly extended to fill the empty part of the opening. Accordingly, the phase change material pattern contacts the top surfaces of the sidewalls of the heating electrode, and the volume of the program region of the phase change material pattern is reduced by the opening. As a result, the phase change memory device can achieve high integration and low power consumption by minimizing the amount of the operation current.

On the other hand, in the first embodiment, the phase change memory device can be readily made by self-aligning the phase change material pattern and the heating electrode.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A phase change memory device, comprising:
a mold layer disposed on a substrate;
a substantially cylindrical heating electrode disposed in an opening in the mold layer, and the heating electrode having a bottom portion disposed on the substrate and a sidewall conformally disposed on an inner wall of the opening;
a filling insulation pattern in the opening, the filling insulation pattern surrounded by the sidewall of the heating electrode;
a cylindrical gap region in the mold layer, the cylindrical gap region defined by an upper portion of the inner wall of the opening, a top surface of the sidewall of the heating electrode and an outer wall of the filling insulation pattern; and
a phase change material pattern disposed on the mold layer and the filling insulation pattern, and disposed in the cylindrical gap region, the phase change material pattern contacting the top surface of the sidewall of the heating electrode, wherein the top surface of the sidewall of the heating electrode is lower than a top surface of the mold layer, and a contacting interface between the heating electrode and the phase change material pattern is located inside the opening.

2. The device as set forth in claim 1, wherein a program region of the phase change material pattern is defined by the cylindrical gap region in the mold layer.

3. The device as set forth in claim 1, wherein a top surface of the filling insulation pattern has the same height as that of the top surface of the mold layer with respect to the substrate, and wherein top edges of the opening and top edges of the filling insulation pattern are curved.

4. The device as set forth in claim 2, wherein a top surface of the filling insulation pattern is lower than a top surface of the mold layer and higher than the top surfaces of the sidewalls of the heating electrode, and wherein top edges of the opening and top edges of the filling insulation pattern are curved.

5. The device as set forth in claim 1, further comprising a conductive barrier pattern disposed on the phase change material pattern.

* * * * *